(12) United States Patent
Yasuda et al.

(10) Patent No.: US 7,541,860 B2
(45) Date of Patent: Jun. 2, 2009

(54) CURRENT CONTROL CIRCUIT USED FOR VOLTAGE BOOSTER CIRCUIT

(75) Inventors: Eiji Yasuda, Osaka (JP); Tadayoshi Nakatsuka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/043,310

(22) Filed: Mar. 6, 2008

(65) Prior Publication Data

US 2008/0218240 A1    Sep. 11, 2008

(30) Foreign Application Priority Data

Mar. 9, 2007    (JP) .............................. 2007-059469

(51) Int. Cl.
    *G05F 3/00*    (2006.01)
(52) U.S. Cl. ............................. 327/536; 326/87; 363/60
(58) Field of Classification Search .................. 326/87;
    327/536; 363/59, 60
    See application file for complete search history.

(56) References Cited

U.S. PATENT DOCUMENTS

| 4,755,695 | A | * | 7/1988 | Suzuki | .......................... 326/17 |
| 4,967,105 | A | * | 10/1990 | Akamatsu et al. | ............. 326/87 |
| 5,483,486 | A | * | 1/1996 | Javanifard et al. | ...... 365/185.17 |
| 5,650,742 | A |  | 7/1997 | Hirano | |
| 5,811,991 | A | * | 9/1998 | Takashima | .................... 326/97 |
| 5,909,128 | A | * | 6/1999 | Maeda | ........................ 326/116 |
| 6,078,194 | A | * | 6/2000 | Lee | ............................. 326/116 |
| 7,020,453 | B2 |  | 3/2006 | Hidaka et al. | |
| 7,427,888 | B2 | * | 9/2008 | Zhang et al. | ................. 327/536 |

FOREIGN PATENT DOCUMENTS

| JP | 07-074619 | 3/1995 |
| JP | 07-321638 | 12/1995 |
| JP | 11-055156 | 2/1999 |
| WO | WO 03/107551 A1 | 12/2003 |

\* cited by examiner

*Primary Examiner*—Lincoln Donovan
*Assistant Examiner*—William Hernandez
(74) *Attorney, Agent, or Firm*—McDermott Will & Emery LLP

(57) ABSTRACT

When a low level voltage is inputted to an input terminal IN, a transistor EF1 enters a blocked state, a first switch circuit SW1 enters a conduction state, and a second switch circuit SW2 enters the blocked state. Accordingly, a boosted voltage outputted from a voltage booster circuit CP is applied to a load R. When a high level voltage is inputted to the input terminal IN, the transistor EF1 enters the conduction state, the first switch circuit SW1 enters the blocked state, and the second switch circuit SW2 enters the conduction state. Accordingly, a voltage equivalent to that at the external power supply terminal VDD is applied to the load R. Therefore, although a current constantly flows through the transistor EF1 when the boosted voltage is not required, such situation does not affect a current supplied from the voltage booster circuit CP.

10 Claims, 10 Drawing Sheets

CURRENT CONTROL CIRCUIT USED FOR VOLTAGE BOOSTER CIRCUIT

BACKGROUND OF THE INVENTION

1. Field of the Invention

The present invention relates to a circuit which includes a DCFL (Direct Coupled FET Logic) circuit configured with a depletion-mode FET or an enhancement-mode FET and which controls a current supplied from a voltage booster circuit.

2. Description of the Background Art

As is already known, a voltage booster circuit is a circuit for boosting an external power supply voltage and generating a voltage higher than the external power supply voltage. The voltage booster circuit is increasingly integrated into a semiconductor circuit. Further, various types of GaAs (gallium arsenide) monolithic microwave integrated circuits (MMIC) each incorporating the voltage booster circuit have been proposed for the sake of improvements in high-frequency characteristics and in response to a recent tendency toward a low voltage.

In the case of a semiconductor integrated circuit including the voltage booster circuit, a boosted voltage to be outputted from the voltage booster circuit is determined in accordance with a current supply capacity of the voltage booster circuit and a current supplied to a circuit connected to the voltage booster circuit. Accordingly, in order to boost the voltage efficiently, it is necessary to increase the current supply capacity of the voltage booster circuit, or to decrease the current supplied to the circuit connected to the voltage booster circuit. To increase the current supply capacity of the voltage booster circuit leads to an increase in a chip size and also to an increase in a consumption current, and thus is not effective means. Therefore, it is most important to decrease the current supplied to the circuit connected to the voltage booster circuit.

In the semiconductor integrated circuit including the voltage booster circuit, a logic circuit, which controls the boosted voltage boosted by the voltage booster circuit or which converts a voltage level of a signal into the boosted voltage, may be used as the circuit connected to the voltage booster circuit. For example, see Japanese Laid-Open Patent Publication No. 7-321638.

A conventional logic circuit for controlling the boosted voltage or converting a voltage will be described. FIG. 9 is a diagram showing a conventional logic circuit 110 including an inverter circuit (logic gate) INV configured with an enhancement-mode FET or a depletion-mode FET. FIG. 10 is a diagram showing a conventional logic circuit 120 in which an output drive circuit DR is provided at a stage subsequent to the inverter circuit INV so as to increase a load driving capacity at a stage thereafter. For example, see Japanese Laid-Open Patent Publication No. 7-074619.

In the conventional logic circuit 110, a high level voltage signal or a low level voltage signal is inputted to an input terminal IN. The voltage booster circuit CP boosts a voltage inputted from an external power supply terminal VDD, and a resultant boosted voltage is outputted from a boosted voltage supply terminal VCP. A load R is configured with a resistance element, the depletion-mode FET, and the like. A transistor EF1 is a drive transistor and configured with the enhancement-mode FET, and is located between the load R and a grounding voltage source VSS (e.g., 0V).

When a high level voltage (e.g., 0.7V) is inputted to the input terminal IN, the transistor EF1 enters a conduction state, and the inverter circuit INV outputs a low level voltage (e.g., 0V). On the other hand, when the low level voltage is inputted to the input terminal IN, the transistor EF1 enters an blocked state, and the inverter circuit INV outputs the boosted voltage (e.g., 7V).

Further, the conventional logic circuit 120 includes the inverter circuit INV similar to that in the logic circuit 110 and an output drive circuit DR constituting a push-pull circuit. The output drive circuit DR includes a pull-up transistor EF2, and a pull-down transistor EF3, each of which is configured with the enhancement-mode FET.

When the high level voltage (e.g., 0.7V) is inputted to the input terminal IN, the transistor EF1 enters the conduction state, and the inverter circuit INV outputs the low level voltage (e.g., 0V). In response to the output, the transistor EF2 enters the blocked state and the transistor EF3 enters the conduction state, and thus the output drive circuit DR outputs the low level voltage (0V). On the other hand, when the low level voltage is inputted to the input terminal IN, the transistor EF1 enters the blocked state, and the inverter circuit INV outputs the boosted voltage (e.g., 7V). In response to the output, the transistor EF2 enters the conduction state, and the transistor EF3 enters the blocked state, and thus the output drive circuit DR outputs the boosted voltage (7V).

The conventional logic circuit 120 shown in FIG. 10 has the push-pull type output drive circuit DR placed at the stage subsequent to the inverter circuit INV, and thus the load drive capacity at the time of outputting the boosted voltage can be increased.

However, the above-described conventional logic circuits 110 and 120 which use the DCFL circuit configured with the enhancement-mode or depletion-mode FET so as to control the boosted voltage or to convert the voltage have the following problem.

When the low level voltage is inputted to the input terminal IN, and the transistor EF1 is in the blocked state, the current hardly flows from the boosted voltage supply terminal VCP to the grounding voltage source VSS, and thus the current is hardly consumed by the inverter circuit INV. Accordingly, the current supplied from the boosted voltage supply terminal VCP is determined in accordance with the load connected to the output terminal OUT.

However, when the high level voltage is inputted to the input terminal IN, and the transistor EF1 is in the conduction state, a current supplied from the voltage booster circuit CP becomes equal to the current which flows from the boosted voltage supply terminal VCP to the grounding voltage source VSS and which is consumed by the inverter circuit INV, since the transistor EF1 is the enhancement-mode FET. That is, in the conventional logic circuits 110 and 120, while the high level voltage is inputted to the input terminal IN, the current flows through the transistor EF1 constantly.

That is, the boosted voltage outputted from the voltage booster circuit CP is determined in accordance with a total output current supplied to a plurality of logic circuits connected to the voltage booster circuit CP. Accordingly, in the case where the logic circuit is configured with the enhancement-mode FET or the depletion-mode FET, an unnecessary current needs to be supplied from the voltage booster circuit CP, compared to a case where the logic circuit is configured with a MOS transistor, and consequently a decrease in the boosted voltage may be caused.

In order to solve the problem, a method is considered in which the load R of the inverter circuit INV is adjusted, whereby the current supplied from the voltage booster circuit CP is reduced when the high level voltage is inputted to the input terminal IN. However, the method of reducing the current with the use of the load R of the inverter circuit INV may cause an increase in a chip area and also cause a delay in switching time, and thus the method is not effective.

SUMMARY OF THE INVENTION

Therefore, an object of the present invention is to provide a current control circuit which avoids unnecessary current supply from a voltage booster circuit, and which is capable of increase voltage boosting efficiency even in the case where a DCFL circuit configured with a depletion-mode FET or an enhancement-mode FET is used.

The present invention is directed to a current control circuit which is used for a voltage booster circuit and which has a direct coupled FET logic circuit configured with a depletion-mode FET or with an enhancement-mode FET. To attain the above object, the current control circuit according to the present invention comprises: a logic circuit including a transistor section, which outputs one of a high level voltage and a low level voltage to a drain of the transistor section in accordance with a logic signal inputted to a gate of the transistor section, and including a load, where one end of the load is connected to the drain of the transistor section; a first switch circuit which is placed between the other end of the load and a power supply end of the voltage booster circuit, and which enters a conduction state when the high level voltage is outputted to the drain of the transistor section; and a second switch circuit which is placed between the other end of the load and an external power supply, and which enters the conduction state when the low level voltage is outputted to the drain of the transistor section.

Preferably, the first switch circuit is the depletion-mode FET, and a drain, a source and a gate of the first switch circuit are connected to the power supply end of the voltage booster circuit, the other end of the load, and the one end of the load, respectively. Further, the second switch circuit is the depletion-mode FET, and a drain, a source and a gate of the second switch circuit are connected to the external power supply, the other end of the load, and a control section, respectively. The control section controls a gate voltage of the second switch circuit, switches the second switch circuit to a blocked state when the first switch circuit is in the conduction state, and switches the second switch circuit to the conduction state when the first switch circuit is in the blocked state.

Further, the second switch circuit may be a diode element whose anode is connected to the external power supply, and whose cathode is connected to the other end of the load. The diode element may be one of the depletion-mode FET and the enhancement-mode FET, and a gate and a drain (or a source) of the diode element are connected to an external power supply, and a source (or a drain) of the enhancement-mode FET is connected to the other end of the load. Alternatively, the gate of the enhancement-mode FET is connected to the external power supply, and the drain and the source of enhancement-mode FET are connected to the other end of the load.

Further, the transistor section may be configured with a plurality of transistors whose drains and sources are connected to one another in a parallel manner, or configured with a plurality of transistors whose drains and sources are connected to one another in a serial manner. In this case, independent logic signals can be inputted to respective gates of the plurality of the transistors, respectively.

Further, a push-pull circuit may be provided in which a voltage outputted from the transistor section is inputted to a gate of a pull-up transistor, and the logic signal inputted to the transistor section is inputted to a gate of a pull-down transistor.

According to the present invention, the switch circuit is used, and when the boosted voltage is not outputted to the output terminal, a configuration is switched such that the boosted voltage supply terminal of the voltage booster circuit is not connected to the load. Accordingly, when an extra current is supplied to a drive transistor, a current path of the voltage booster circuit can be isolated. Therefore, the current supplied from the voltage booster circuit can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
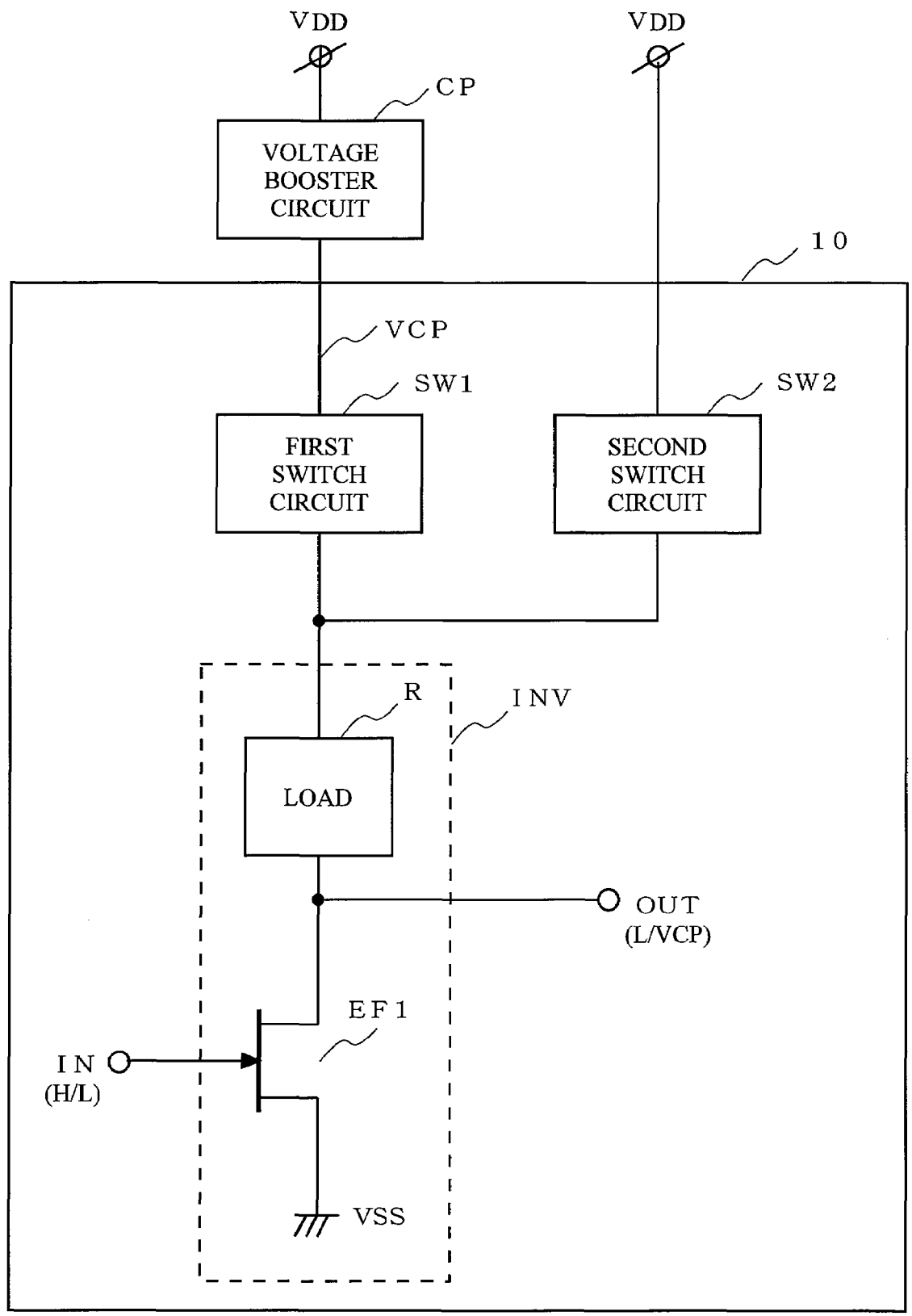
FIG. 1 is a circuit diagram showing a configuration of a current control circuit 10 according to a first embodiment of the present invention.

FIG. 1 is a circuit diagram showing a configuration of a current control circuit 10 used for a voltage booster circuit CP according to a first embodiment of the present invention. As shown in FIG. 1, the current control circuit 10 according to the first embodiment has a first switch circuit SW1, a second switch circuit SW2, and an inverter circuit INV which includes a load R and a transistor EF1.

The voltage booster circuit CP boosts a voltage inputted from an external power supply terminal VDD, and outputs a resultant boosted voltage from the boosted voltage supply terminal VCP. The transistor EF1 is an enhancement-mode FET for driving a voltage booster circuit, and a gate, a drain, and a source thereof are connected to an input terminal IN, one end of the load R and an output terminal OUT, and a grounding voltage source VSS (e.g., 0V), respectively. The load R is configured with a resistance element, a depletion-mode FET and the like. A high level voltage signal or a low level voltage signal is inputted to the input terminal IN. The first switch circuit SW1 is placed between a boosted voltage supply terminal VCP and the other end of the load R. The second switch circuit SW2 is placed between an external power supply terminal VDD and the other end of the load R.

Figure 9:
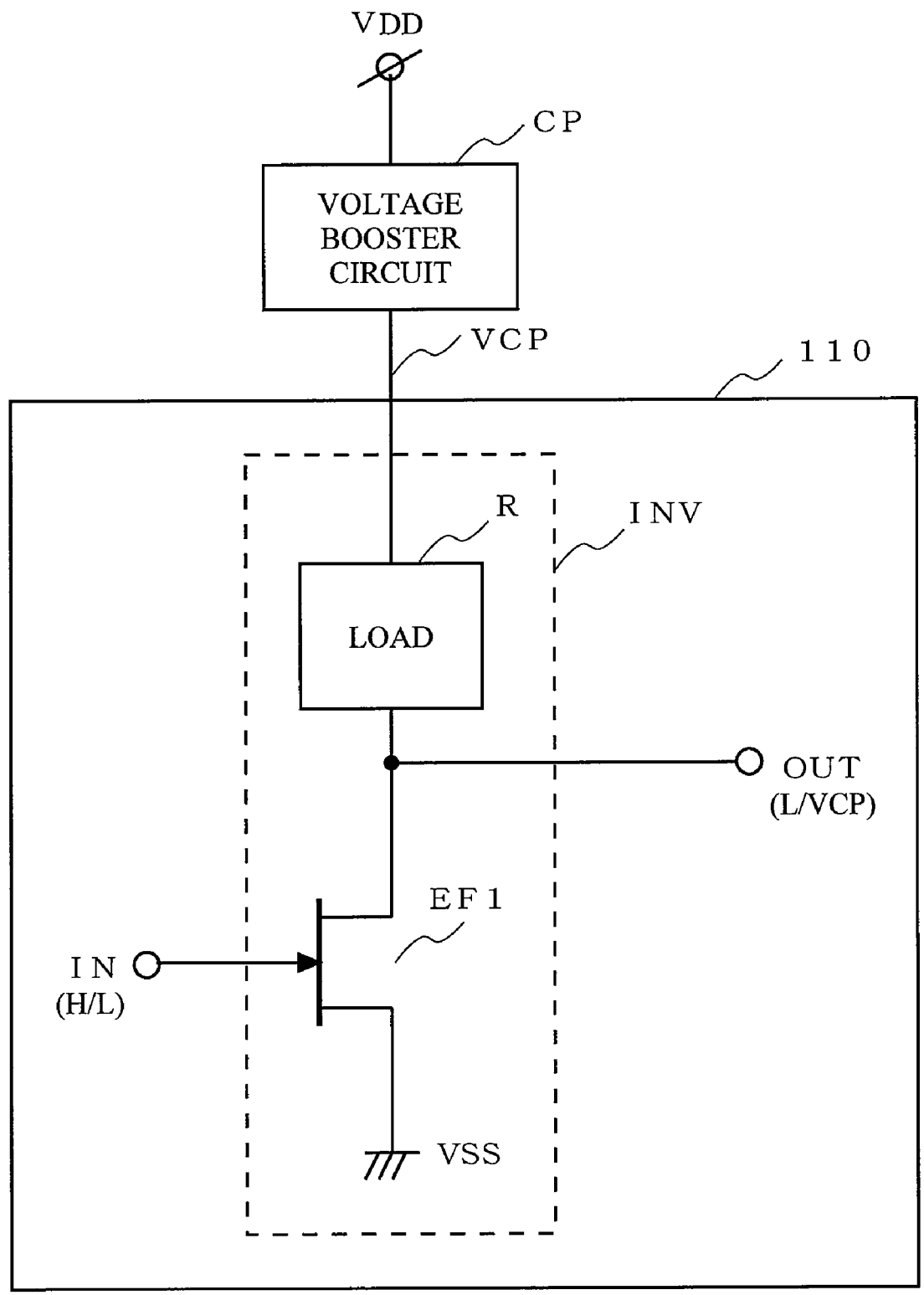
FIG. 9 is a circuit diagram showing a configuration of a conventional logic circuit 110.
Figure 10:
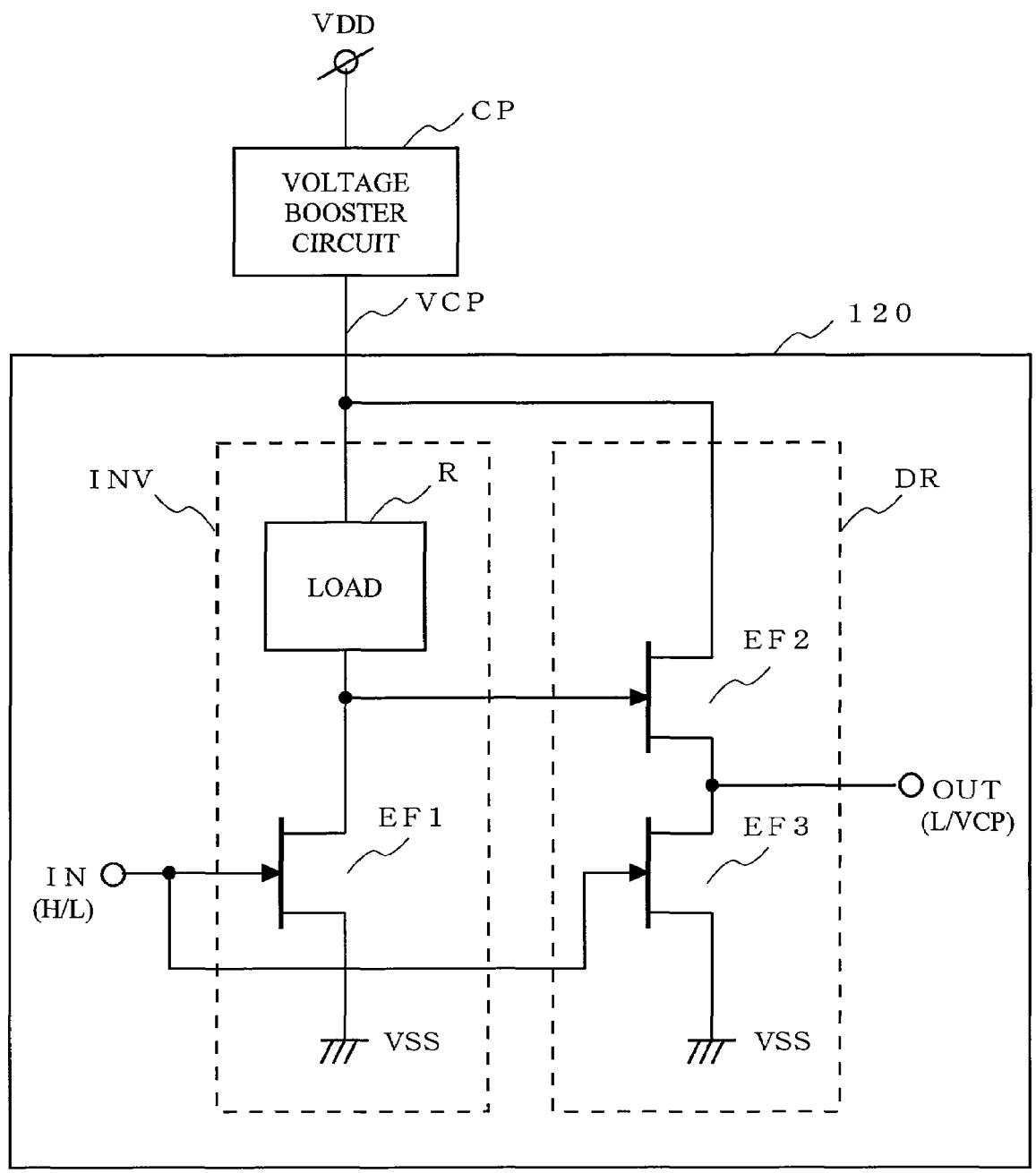
FIG. 10 is a circuit diagram showing a configuration of a conventional logic circuit 120.

As is clear from comparison between the configuration of the present invention shown in FIG. 1 and a conventional configuration shown in FIG. 9, the configuration of the present invention characteristically includes the first switch circuit SW1 and the second switch circuit SW2 in addition to the conventional configuration.

In the first embodiment, a basic control operation of the present invention in which the first switch circuit SW1 and the second switch circuit SW2 are used will be described. In the second embodiment and thereafter, configurations of the first switch circuit SW1 and the second switch circuit SW2 will be described in detail.

First, when the low level voltage (e.g., 0V) is inputted to the input terminal IN, the first switch circuit SW1 switches a connection thereof to a conduction state, and the second switch circuit SW2 switches a connection thereof to a blocked state. Accordingly, the boosted voltage (e.g., 7V) outputted from the voltage booster circuit CP is applied to the other end of the load R. The transistor EF1 having the low level voltage inputted to the gate thereof is switched to the blocked state. Therefore, a voltage obtained by subtracting an amount of voltage drop, which is caused by the load R, from the boosted voltage, which is outputted to the boosted voltage supply terminal VCP, appears at the drain of the transistor EF1, i.e., at the output terminal OUT.

When the high level voltage (e.g., 0.7V) is inputted to the input terminal IN, the first switch circuit SW1 switches the connection thereof to the blocked state, and the second switch circuit SW2 switches the connection thereof to the conduction state. Accordingly, a voltage (e.g., 3V) equal to that at the external power supply terminal VDD is applied to the other end of the load R. The transistor EF1 having the high level voltage inputted to the gate thereof is switched to the conduction state. Therefore, the voltage at the grounding voltage source VSS appears at the drain of the transistor EF1, i.e., the output terminal OUT. However, in this case, a current is supplied to the other end of the load R directly from the external power supply terminal VDD, and thus the current supplied from the voltage booster circuit CP is not affected if the current constantly flows through the transistor EF1.

In this manner, according to the first embodiment of the present invention, the first switch circuit SW1 and the second switch circuit SW2 are used, and when the boosted voltage is to be outputted to the output terminal OUT, the configuration is switched, in the same manner as the conventional configuration, such that the boosted voltage supply terminal VCP of the voltage booster circuit CP is connected to the load R, whereas when the boosted voltage is not to be outputted to the output terminal OUT, the configuration is switched such that the boosted voltage supply terminal VCP of the voltage booster circuit CP is not connected to the load R. Accordingly, a current of the voltage booster circuit CP can be isolated when an extra current flows through the transistor EF1 for driving the voltage booster circuit. Accordingly, the current supplied from the voltage booster circuit CP can be minimized.

Second Embodiment

Figure 2:
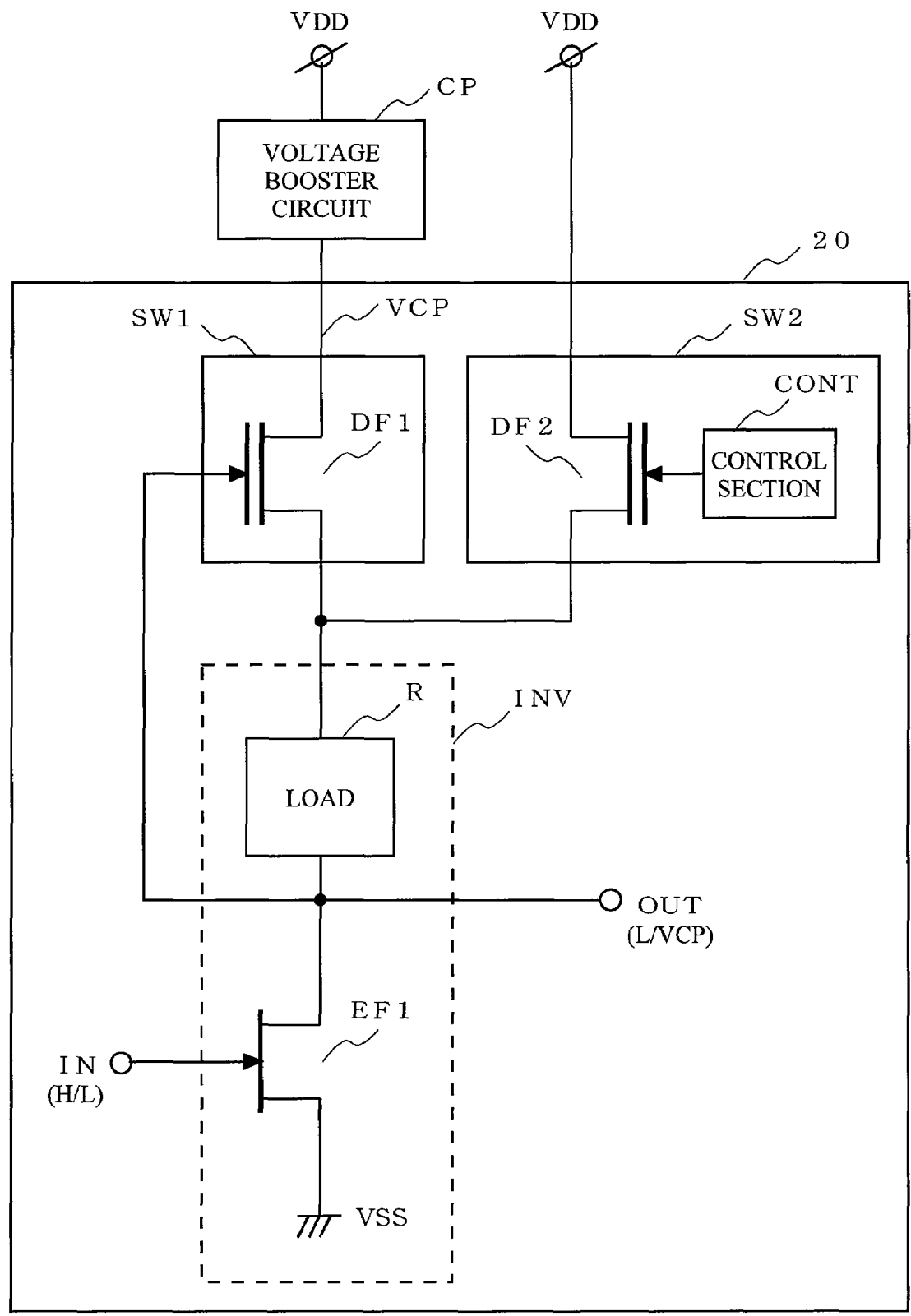
FIG. 2 is a circuit diagram showing a configuration of a current control circuit 20 according to a second embodiment of the present invention.

FIG. 2 is a circuit diagram showing a configuration of a current control circuit 20 used for a voltage booster circuit CP according to a second embodiment of the present invention. The current control circuit 20 according to the second embodiment is an exemplary configuration in which the first switch circuit SW1 shown in FIG. 1 is replaced with a transistor DF1, which is a depletion-mode FET, and the second switch circuit SW2 shown in FIG. 1 is replaced with a control section CONT and a transistor DF2, which is a depletion-mode FET.

A drain of the transistor DF1 is connected to the boosted voltage supply terminal VCP of the voltage booster circuit CP. A source of the transistor DF1 is connected to the other end of the load R, and a gate thereof is connected to one end of the load R, i.e., the output terminal OUT. A drain of the transistor DF2 is connected to the external power supply terminal VDD. A source of the transistor DF2 is connected to the other end of the load R, and a gate thereof is connected to the control section CONT.

When a low level voltage is inputted to the input terminal IN, the transistor EF1 enters a blocked state. Accordingly, a voltage at the drain of the transistor EF1, that is, at the output terminal OUT temporarily becomes an unstable high level. The high level voltage is inputted to the gate of the transistor DF1, and consequently the transistor DF1 is switched a conduction state. The transistor DF1 enters the conduction state, and the boosted voltage (e.g., 7V) outputted from the voltage booster circuit CP appears at the other end of the load R. On the other hand, the control section CONT applies the low level voltage (e.g., 0V) to the gate of the transistor DF2, and sets a voltage Vgs (e.g., −7V) between the gate and the source of the transistor DF2 lower than a threshold value (e.g., −1.2V) so as to cause the transistor DF2 to be in the blocked state.

When the high level voltage is inputted to the input terminal IN, the transistor EF1 enters the conduction state. Accordingly, a voltage of the grounding voltage source VSS appears at the drain of the transistor EF1, that is, at the output terminal OUT, and the voltage at the output terminal OUT becomes the low level. On the other hand, the control section CONT applies a high level voltage (e.g., 3V) to the gate of the transistor DF2, and switches the transistor DF2 to the conduction state. Accordingly, the low level voltage is inputted to the gate of the transistor DF1, and the voltage Vgs (e.g., −3V) between the gate and the source of the transistor DF1 becomes lower than the threshold value, and consequently the transistor DF1 enters the blocked state.

As above described, according to the second embodiment of the present invention, the depletion-mode FET is used for each of the first switch circuit SW1 and the second switch circuit SW2, whereby a current control circuit having a simple configuration can be realized.

It is understood that the control section CONT detects voltages at the input terminal IN, the output terminal OUT and the like, thereby easily determining a voltage level applied to the gate of the transistor DF1.

Third Embodiment

Figure 3:
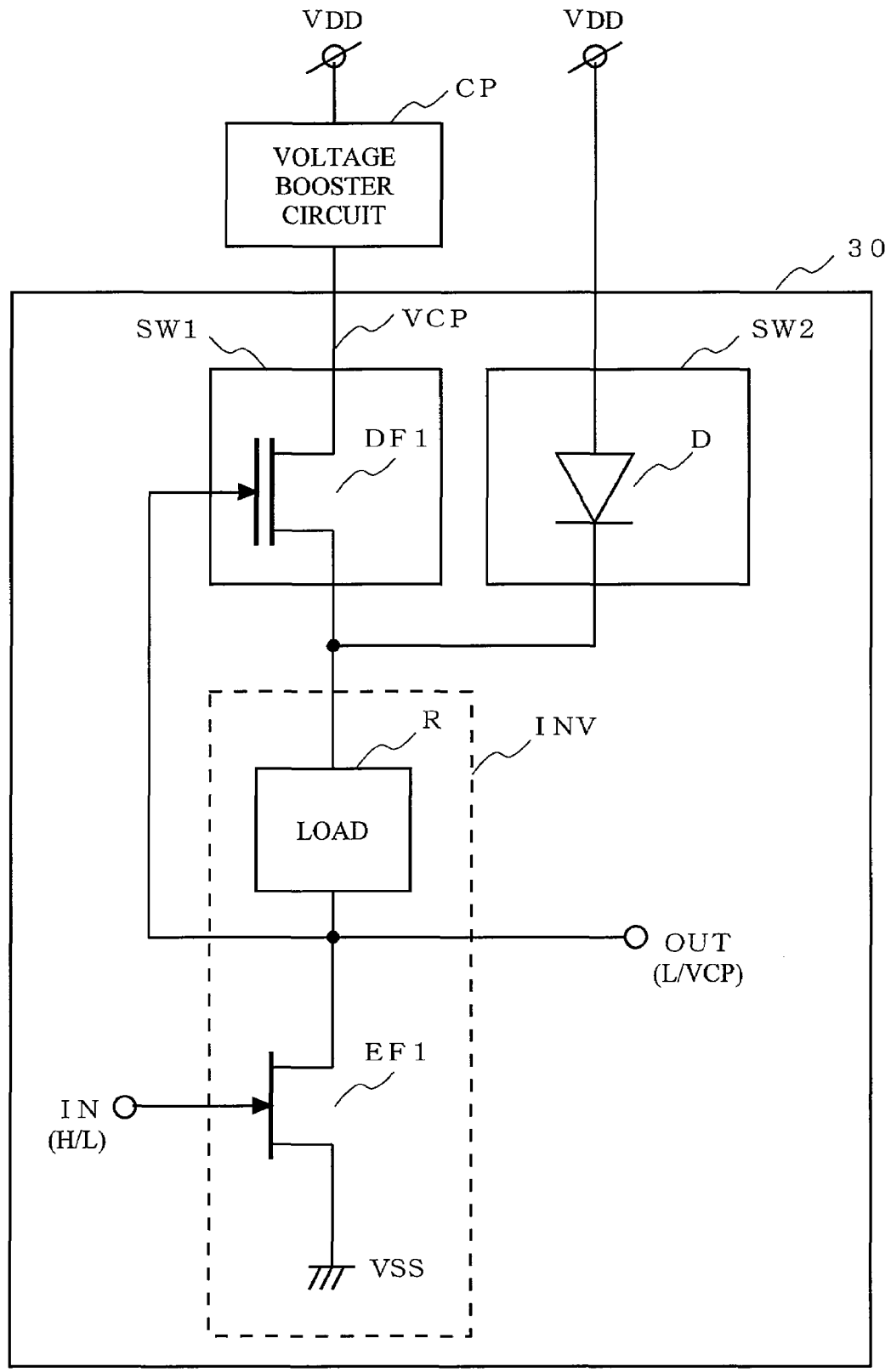
FIG. 3 is a circuit diagram showing a configuration of a current control circuit 30 according to a third embodiment of the present invention.

FIG. 3 is a circuit diagram showing a configuration of a current control circuit 30 used for a voltage booster circuit CP according to a third embodiment of the present invention. The current control circuit 30 according to the third embodiment has an exemplary configuration in which the second switch circuit SW2 shown in FIG. 2 is configured with a diode element D.

An anode of the diode element D is connected to an external power supply terminal VDD, and a cathode thereof is connected to the other end of the load R.

When a low level voltage is inputted to the input terminal IN, the transistor EF1 enters a blocked state. Accordingly, a voltage at the drain of the transistor EF1, that is, at the output terminal OUT temporarily becomes an unstable high level. The high level voltage is inputted to the gate of the transistor DF1, and consequently the transistor DF1 is switched to a conduction state. Therefore, the transistor DF1 enters the conduction state, and the boosted voltage (e.g., 7V) outputted from the voltage booster circuit CP appears at the other end of the load R. In this case, the voltage is applied to the diode element D in a reverse direction, and thus the diode element D is in the blocked state.

When a high level voltage is inputted to the input terminal IN, the transistor EF1 enters the conduction state. Accordingly, a voltage of the grounding voltage source VSS appears at the drain of the transistor EF1, that is, at the output terminal OUT, and the voltage at the output terminal OUT becomes a low level. In this case, the voltage is applied to the diode element D in a forward direction, and the diode element D is in the conduction state. Accordingly, a voltage (e.g., 2.7V), which is obtained by subtracting an amount of voltage drop (e.g., 0.3V) at the diode element D from the external power supply terminal VDD (e.g., 3V), is applied to the other end of the load R. Therefore, the low level voltage is inputted to the gate of the transistor DF1, and the voltage Vgs (e.g., −2.7V) between the gate and the source of the transistor DF1 becomes greater than the threshold value, and consequently transistor DF1 enters the blocked state.

As above described, according to the third embodiment of the present invention, the diode element D is used for the second switch circuit SW2, whereby a configuration of the control section CONT can be omitted.

Figure 4:
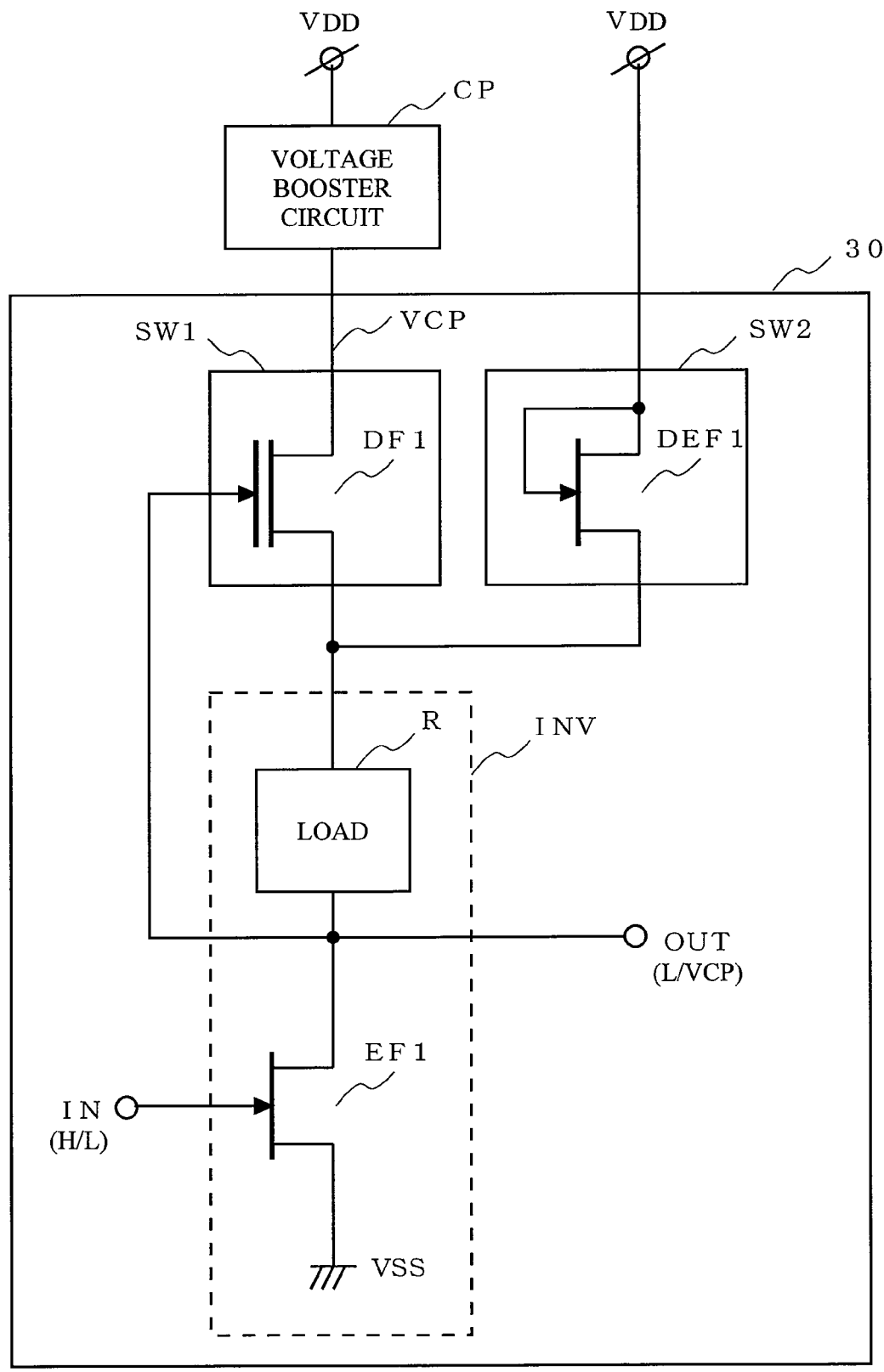
FIGS. 4 and 5 are each a circuit diagram showing, in detail, an exemplary configuration of the current control circuit 30.
Figure 5:
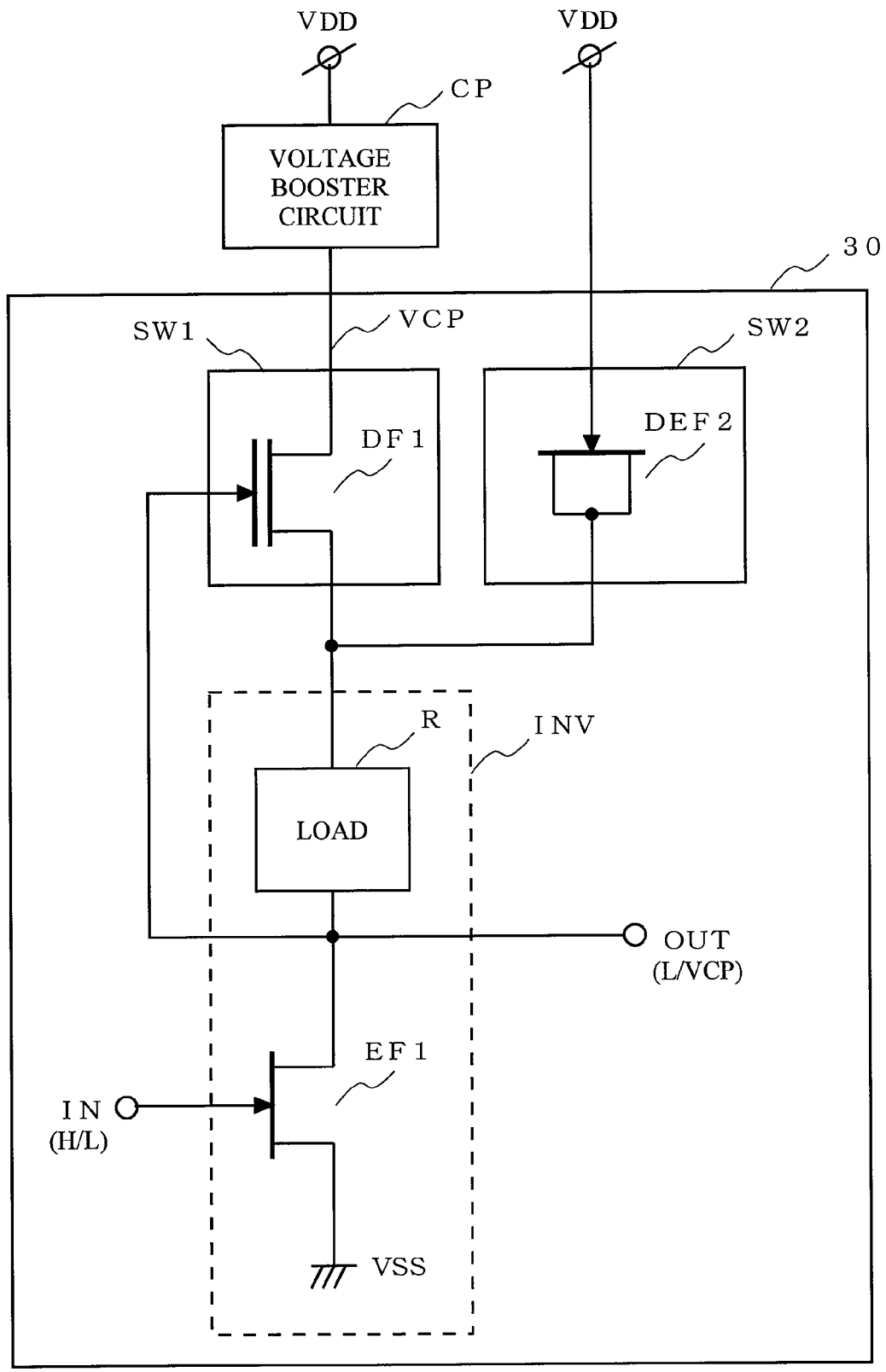

The diode element D can be easily realized by connecting the drain (or the source) and the gate of the transistor DEF1 (FIG. 4) or by connecting the drain and the source of the transistor DEF2 (FIG. 5), the transistor DEF1 and the transistor DEF2 being configured with the depletion-mode or with the enhancement-mode FET.

Fourth Embodiment

Figure 6:
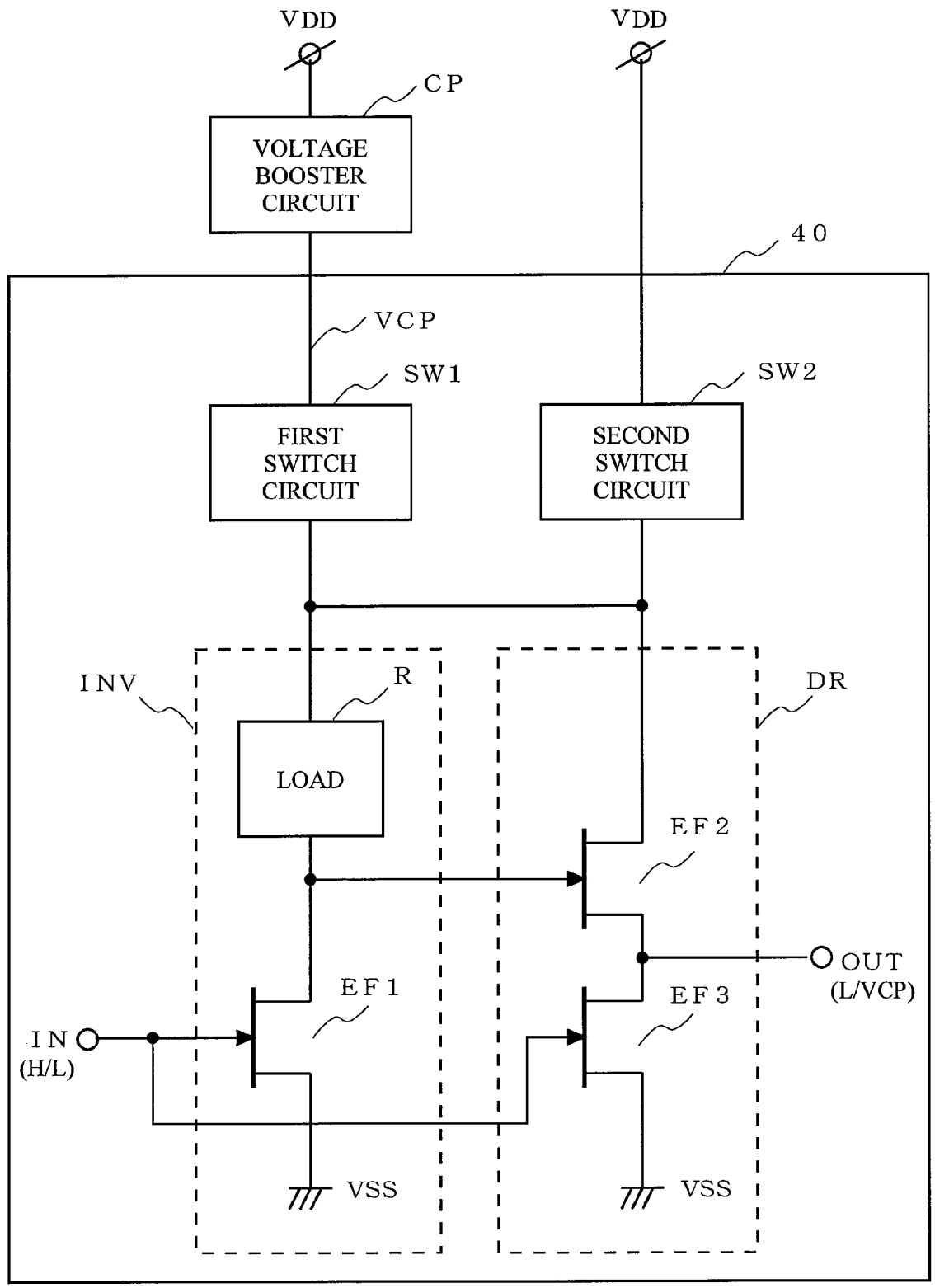
FIG. 6 is a circuit diagram showing a configuration of a current control circuit 40 according to a fourth embodiment of the present invention.

FIG. 6 is a circuit diagram showing a configuration of a current control circuit 40 used for a voltage booster circuit CP according to a fourth embodiment of the present invention. As shown in FIG. 6, the current control circuit 40 according to the fourth embodiment has the first switch circuit SW1, the second switch circuit SW2, the inverter circuit INV including the load R and the transistor EF1, and an output drive circuit DR including the transistors EF2 and EF3.

The current control circuit 40 has a configuration in which the output drive circuit DR is added to the output terminal OUT of the current control circuit 10 according to the above-described first embodiment. The output drive circuit DR constitutes a push-pull circuit including the pull-up transistor EF2 a pull-down transistor EF3.

When the inverter circuit INV outputs a low level voltage, the transistor EF2 enters a blocked state, and the transistor EF3 enters a conduction state. Accordingly, the output drive circuit DR outputs the low level voltage. On the other hand, when the inverter circuit INV outputs a high level voltage (boosted voltage), the transistor EF2 enters the conduction state, and the transistor EF3 enters the blocked state. Accordingly, the output drive circuit DR outputs the high level voltage (boosted voltage).

As above described, according to the fourth embodiment of the present invention, the output drive circuit DR having the push-pull configuration is provided at a stage subsequent to the inverter circuit INV, and thus a load drive capacity at the time of outputting the boosted voltage can be increased.

The above-described fourth embodiment is exemplified by a case where the output drive circuit DR is applied to the current control circuit 10 according to the first embodiment. However, the output drive circuit DR may also be applied to the current control circuits 20 and 30 according to the second and third embodiments.

Fifth Embodiment

Figure 7:
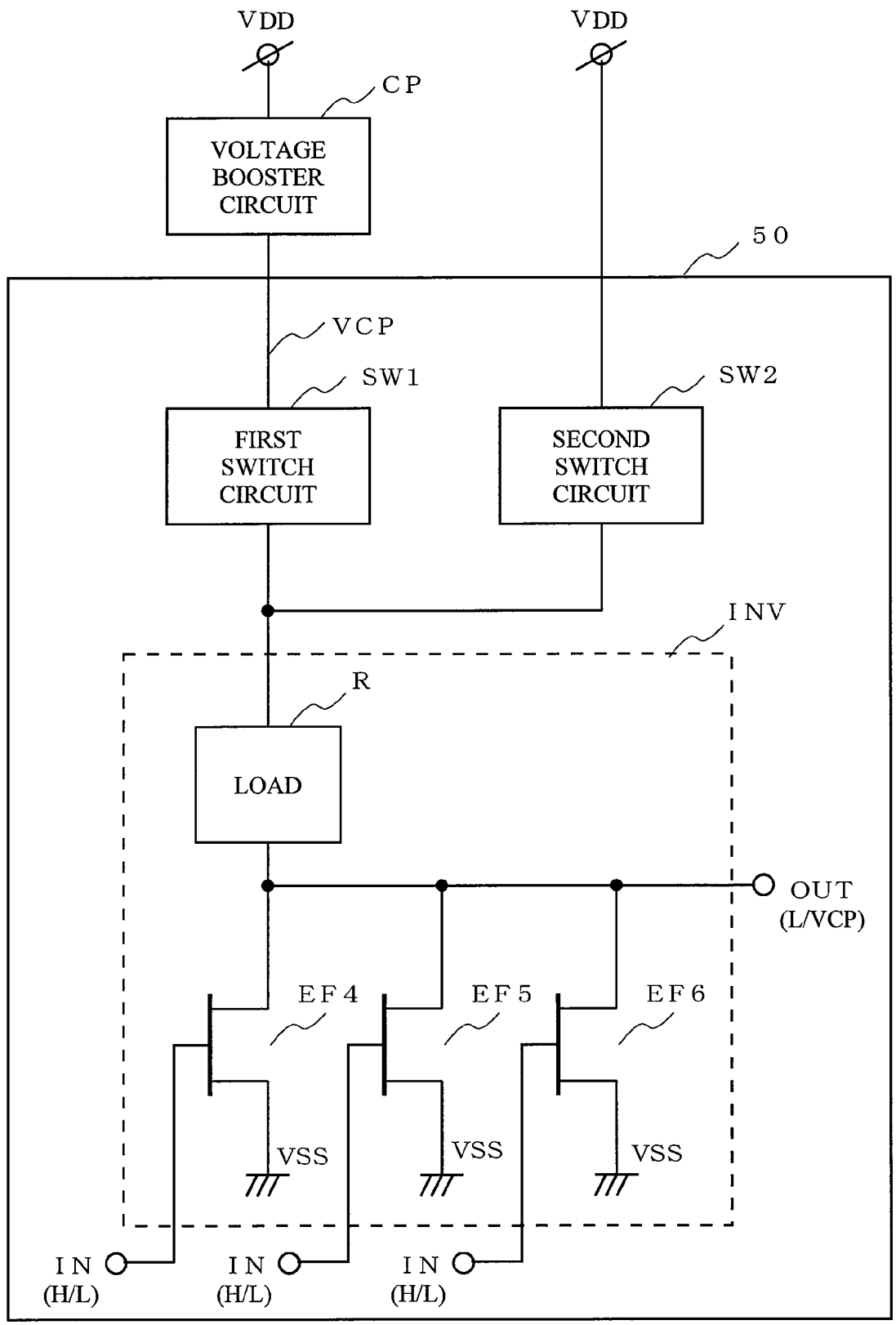
FIGS. 7 and 8 are circuit diagrams respectively showing current control circuits 50 and 60 according to a fifth embodiment of the present invention.

FIG. 7 is a circuit diagram showing a configuration of a current control circuit 50 used for a voltage booster circuit CP according to a fifth embodiment of the present invention. As shown in FIG. 7, the current control circuit 50 has the first switch circuit SW1, the second switch circuit SW2, and the inverter circuit INV including the load R and three transistors EF4 to EF6, the three transistors being connected in parallel to one another.

Figure 8:
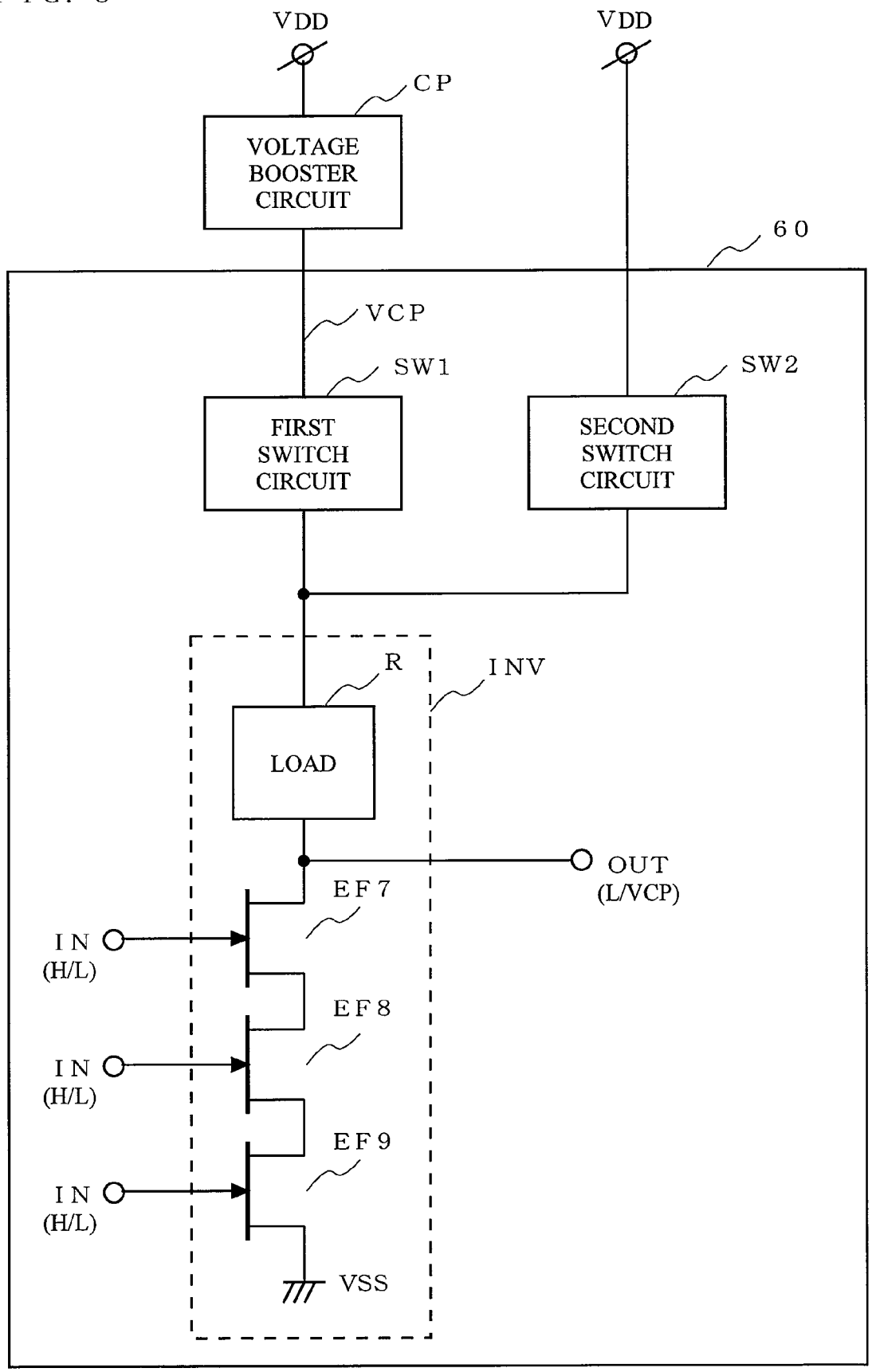

FIG. 8 is a circuit diagram showing a configuration of another current control circuit 60 used for the voltage booster circuit CP according to the fifth embodiment of the present invention. As shown in FIG. 8, the current control circuit 60 has the first switch circuit SW1, the second switch circuit SW2, and the inverter circuit INV including the load R and three transistors EF7 to EF9, the three transistors being serially connected to one another.

The current control circuits 50 and 60 are each configured in order to correspond to a case where a plurality of signals is inputted to the inverter circuit INV. FIG. 7 shows an exemplary configuration in which the transistors EF4 to EF6 are connected in parallel to one another so as to configure a NOR circuit corresponding to three logic signals. FIG. 8 shows an exemplary configuration in which the transistors EF7 to EF9 are connected serially to one another so as to configure a NAND circuit corresponding to three logic signals. Obviously, the number of the transistors connected in parallel or serially is not limited to three.

As above described, according to the fifth embodiment of the present invention, even in the case where the plurality of logic signals is inputted to the inverter circuit INV, the inverter circuit INV can be configured simply.

The above-described fifth embodiment is exemplified by a case where the configuration of the transistors EF4 to EF6 and the configuration of the transistors EF7 to EF9 are applied to the current control circuit 10 according to the first embodiment. However, the configurations may be also applied to the current control circuits 20, 30 and 40 according to the second to fourth embodiments in a similar manner.

While the invention has been described in detail, the foregoing description is in all aspects illustrative and not restrictive. It is understood that numerous other modifications and variations can be devised without departing from the scope of the invention.

What is claimed is:

1. A current control circuit which is used for a voltage booster circuit and which has a direct coupled FET logic circuit configured with a depletion-mode FET or with an enhancement-mode FET, the current control circuit comprising:
    a logic circuit including a transistor section, which outputs one of a high level voltage and a low level voltage to a drain of the transistor section in accordance with a logic signal inputted to a gate of the transistor section, and including a load, where one end of the load is connected to the drain of the transistor section;
    a first switch circuit, which is placed between the other end of the load and a power supply end of the voltage booster circuit, and which enters a conduction state when the high level voltage is outputted to the drain of the transistor section; and
    a second switch circuit which is placed between the other end of the load and an external power supply, and which enters the conduction state when the low level voltage is outputted to the drain of the transistor section.

2. The current control circuit according to claim 1, wherein the first switch circuit is the depletion-mode FET, and a drain, a source and a gate of the first switch circuit are connected to the power supply end of the voltage booster circuit, the other end of the load, and the one end of the load, respectively.

3. The current control circuit according to claim 2, wherein the second switch circuit is the depletion-mode FET, and a drain, a source and a gate of the second switch circuit are connected to the external power supply, the other end of the load, and a control section, respectively, and the control section controls a gate voltage of the second switch circuit, switches the second switch circuit to a blocked state when the first switch circuit is in the conduction state, and switches the second switch circuit to the conduction state when the first switch circuit is in the blocked state.

4. The current control circuit according to claim 1, wherein the second switch circuit is a diode element whose anode is connected to the external power supply, and whose cathode is connected to the other end of the load.

5. The current control circuit according to claim 4, wherein the diode element is one of the depletion-mode FET and the enhancement-mode FET, and a gate and a drain of the enhancement-mode FET are connected to the external power supply, and a source of the enhancement-mode FET is connected to the other end of the load.

6. The current control circuit according to claim 4, wherein the diode element is one of the depletion-mode FET and the enhancement-mode FET, and a gate and a source of the enhancement-mode FET are connected to the external power supply, and a drain of the enhancement-mode FET is connected to the other end of the load.

7. The current control circuit according to claim 4, wherein the diode element is one of the depletion-mode FET and the enhancement-mode FET, and a gate of the enhancement-mode FET is connected to the external power supply, and a drain and a source of the enhancement-mode FET are connected to the other end of the load.

8. The current control circuit according to claim 1, wherein the transistor section is configured with a plurality of transistors whose drains and sources are connected to one another in a parallel manner, and independent logic signals are inputted to respective gates of the plurality of the transistors, respectively.

9. The current control circuit according to claim 1, wherein the transistor section is configured with a plurality of transistors whose drains and sources are connected to one another in a serial manner, and independent logic signals are inputted to respective gates of the plurality of the transistors, respectively.

10. The current control circuit according to claim 1, further comprising a push-pull circuit in which a voltage outputted from the transistor section is inputted to a gate of a pull-up transistor, and the logic signal inputted to the transistor section is inputted to a gate of a pull-down transistor.

* * * * *